(12) United States Patent
Barabi et al.

(10) Patent No.: US 7,583,097 B2
(45) Date of Patent: Sep. 1, 2009

(54) CONTACTOR NEST FOR AN IC DEVICE AND METHOD

(75) Inventors: Nasser Barabi, Lafayette, CA (US); Oksana Kryachek, San Francisco, CA (US); Chee-Wah Ho, Fremont, CA (US)

(73) Assignee: Essai, Inc., Fremont, CA (US)

( * ) Notice: Subject to any disclaimer, the term of this patent is extended or adjusted under 35 U.S.C. 154(b) by 115 days.

(21) Appl. No.: 11/643,630

(22) Filed: Dec. 20, 2006

(65) Prior Publication Data

US 2008/0265924 A1    Oct. 30, 2008

Related U.S. Application Data

(60) Provisional application No. 60/753,825, filed on Dec. 23, 2005.

(51) Int. Cl.
*G01R 31/02* (2006.01)
(52) U.S. Cl. ........................... 324/758; 324/755
(58) Field of Classification Search ................. None
See application file for complete search history.

(56) References Cited

U.S. PATENT DOCUMENTS

| 5,092,774 | A | 3/1992 | Milan |
| 5,451,883 | A | 9/1995 | Staab |
| 6,046,597 | A | 4/2000 | Barabi |
| 6,181,149 | B1 * | 1/2001 | Godfrey et al. ............. 324/761 |
| 6,208,155 | B1 | 3/2001 | Barabi et al. |
| 6,441,632 | B1 | 8/2002 | Correia et al. |
| 6,707,309 | B2 * | 3/2004 | Sato et al. ................... 324/755 |
| 6,743,043 | B2 * | 6/2004 | Yamada ..................... 439/482 |

\* cited by examiner

*Primary Examiner*—Minh N Tang
(74) *Attorney, Agent, or Firm*—Donald L. Beeson; Beeson Skinner Beverly, LLP

(57) ABSTRACT

An improved contactor nest for receiving and holding IC devices against a pin board interposer during the test or burn-in of the devices includes a frame having an IC pocket with a top opening, which is oversized in relation to the footprint of the IC device for which the contactor is designed, and centering guide walls for guiding an IC device to be tested into the pocket from the oversized top opening to the IC device seating plane. The centering guide walls have a gradual angle relative to the insertion axis of the IC pocket, and extend down to a bottom perimeter portion of the IC pocket immediately adjacent the IC seating plane for gradually centering the IC device in the pocket as the IC device approaches the seating plane. Preferably, the angled guide walls extend far enough into the IC pocket to allow the spring pins of the pin board interposer to scrub the contact pads of the IC devices as the IC device is being centered.

21 Claims, 4 Drawing Sheets

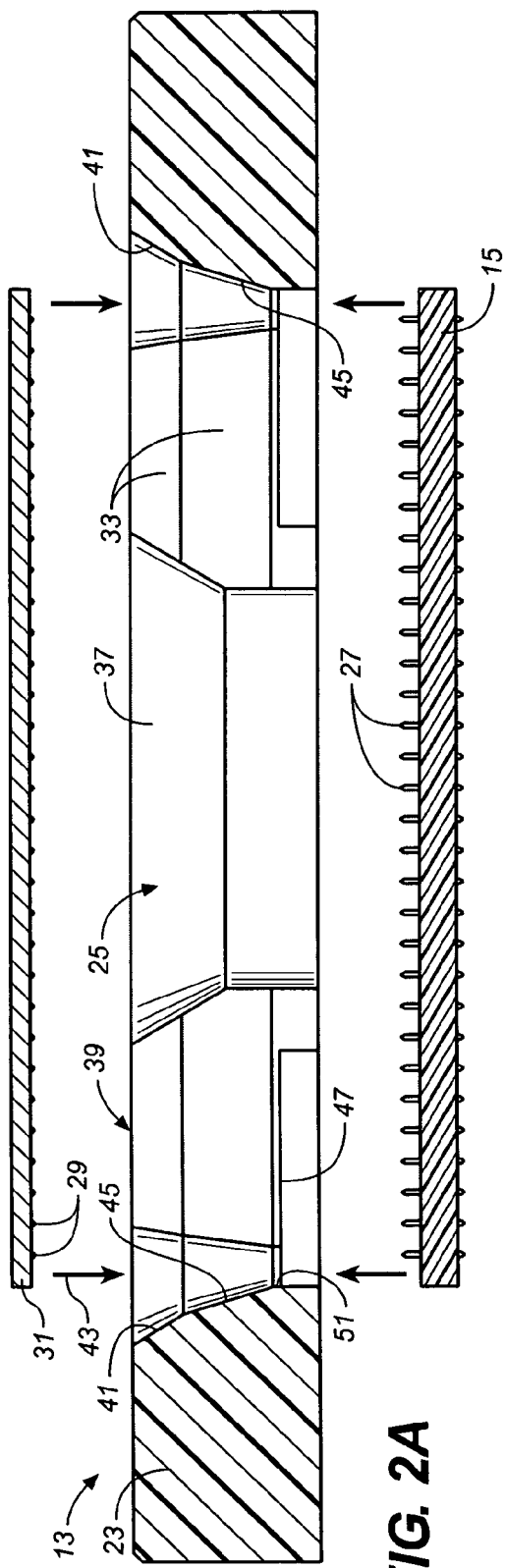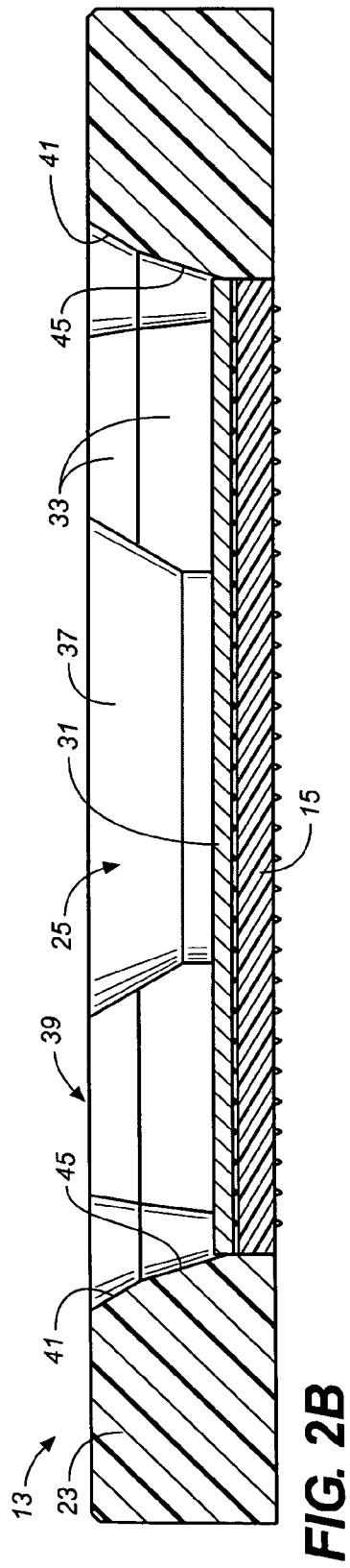

CONTACTOR NEST FOR AN IC DEVICE AND METHOD

CROSS-REFERENCED TO RELATED APPLICATIONS

This application claims the benefit of U.S. Provisional Application No. 60/753,825 filed Dec. 23, 2005.

BACKGROUND OF THE INVENTION

The present invention generally relates to test contactors used to establish an electrical interface between an integrated circuit (IC) device under test and a circuit board, and, more particularly, relates to contactor nests used to guide an IC device into contact with an array of contact pins of an interposer that electrically interfaces with a circuit board.

Contactors are widely used to hold IC devices onto a test or load board for test or burn-in. Such contactors typically include an interposer and contactor nest. The interposer, which contains an array of conductors that match up with the I/O contact pads on the device under test (DUT), provides an electrical interface between the DUT and the test board. The contactor nest guides the DUT onto the interposer. The interposer can be integral part of the contactor or a separate part.

Contactor nests have pockets into which DUTs are typically inserted and removed by automated handling equipment. Typically, the top openings of these pockets have relatively short and sharply angled lead-in walls followed by a relatively long straight-walled guide section that conforms in size and shape to the DUT package for which the contactor is designed. The angled lead-in walls serve to center the IC package in the pocket of the contactor nest as it feeds the DUT into the pocket's straight-walled guide section; the straight-wall section guides the centered IC package the rest of the way through the pocket onto the interposer. However, the difficulty with such contactor nest designs is that DUTs frequently jam as they are passed through the straight-walled guide section of the contactor nest pocket due to the tight tolerance involved and mismatches caused by out-of-tolerance DUTs and thermal expansion. Jamming leads to frequent "drop-outs" of DUTs during high volume testing.

Another problem encountered with existing contactor nest designs has to do with the electrical contact between the IO contact pads on the DUT packages and the electrical interface pins of the interposer of the contactor. The long straight-walled guide portion of the contactor nest acts to guide the centered IC package against the contactor's pin array in a direction that is perfectly perpendicular to the spring pins of the interposer's pin array. Any foreign material that may exist on the contact pads of the DUT is compressed between the DUT's contact pads and the opposing interposer spring pins. If the spring loaded plunger ends of the interposer pins do not exert enough force to break through this foreign material, degradation in the electrical contact will result.

The present invention overcomes the drawbacks of existing contactors by providing an improved contactor nest that significantly reduces the potential for jamming of the chip in the contactor nest, and consequently reduces the frequency of dropouts that occur with automated chip testing equipment. The present invention further provides an improved contactor for an IC device that mitigates the deleterious effects that foreign material on the DUT contact pads have on the conductivity between the pads and the transposer pin array.

SUMMARY OF THE INVENTION

The present invention is an improved contactor nest for receiving and holding IC devices against a pin board interposer during the test or burn-in of the devices. The contactor nest is comprised of a frame having an IC pocket accessible from the top of the frame for receiving an IC device with a defined footprint. The frame's IC pocket has a top opening which is oversized in relation to the footprint of the IC device for which the contactor is designed, and an IC seating plane which is perpendicular to the pocket's insertion axis for the IC device. The IC pocket further includes a bottom perimeter portion at the IC seating plane, which corresponds to the footprint of the IC device. Preferably, the dimensions of the bottom perimeter portion of the IC pocket correspond to the largest possible dimension of the IC device in light of the device's specified tolerances. For example, for a contactor nest design for an IC device having an IC package that has a dimension of 1.00 inches +/−0.10 inch, the corresponding dimension at the bottom perimeter portion of the IC pocket of the frame would be 1.10 inches.

The IC pocket of the frame of the contactor nest includes guide walls for guiding an IC device to be tested into the pocket from the oversized top opening of the pocket to the IC device seating plane. In accordance with the invention, these guide walls include an IC device centering guide wall section having a gradual angle relative to the insertion axis of the pocket. The centering guide wall section extends down to the bottom perimeter portion of the pocket immediately adjacent the IC seating plane for gradually centering the IC device in the pocket as the IC device approaches the seating plane. Preferably, the angle of the guide walls of the IC pocket in the centering guide wall section is in a range between about 2 degrees and 20 degrees in relation to the IC insertion axis.

Further in accordance with the invention, the bottom perimeter portion of the IC pocket can have no depth such that the pocket's centering guide wall section extends down to the seating plane. Alternatively, this bottom perimeter portion can be comprised of a relatively short bottom straight wall section, into which the bottom of the IC device under test drops after it engages the conductive spring pins of a pin board interposer to which the contactor nest is mounted. A suitable depth for the bottom straight wall section of the pocket guide walls is between zero and about 0.50 mm.

The IC pocket of the contactor nest can additionally include a top lead-in wall section having an angle relative to the insertion axis of the IC pocket that is greater than the more gradual angle of the centering section of the guide walls. In such an embodiment, the IC pocket of the frame is a double-angled pocket, wherein the initial angled side walls provide for approximate centering of the IC device in the pocket, and the second, more gradual angle of the final centering side wall section continues to center the IC device more gradually as it approaches the pin board interposer at the bottom of the pocket. By providing continuous and gradual centering of the IC device under test as it approaches the IC seating plane, the risk of jamming the IC device in the pocket will be reduced. Furthermore, the centering action near the bottom of the IC pocket will cause a small degree of lateral movement of the IC device after it engages the spring pins of the interposer, resulting in advantageous scrubbing of the IC device contact pads as the IC device bottoms out in the pocket. Such scrubbing action will dislodge any foreign material on the pads, resulting in improved electrical contact.

The method of the invention involves bringing an IC device under test into electrical contact with the spring pins of a pin board interposer situated at an IC device seating plane, by first approximately centering the IC device so that the pads of the IC device approximately align with the spring pins of the pin board interposer, and then further gradually centering the IC device in relation to the spring pins of the pin board interposer as the IC device is advanced toward the IC device seating plane. The gradual centering action preferably continues to occur until after the IC device under test contacts and begins depressing the spring pins of the pin board interposer.

Therefore, it can be seen that it is a primary object of the present invention to provide an improved contactor nest and method that reduces the risk of jamming as the IC device under test is inserted into and removed from a test contactor. It is a further object of the invention to provide an improved contactor nest and method that reduces the possibility of a degraded electrical contact caused by debris on the conductor pads of the IC device under test. Still other objects of the invention will be apparent from the following specification and claims.

A BRIEF DESCRIPTION OF THE DRAWINGS

FIG. 2A is an exploded, cross-sectional view of the contactor nest and pin board interposer taken along lines 2-2 of FIG. 1, and additionally showing an IC device to be inserted into the contactor nest.

FIG. 2B is a cross-sectional view thereof showing the contact nest mounted over the pin board interposer and the IC device centered in the pocket of the contactor nest in contact with the pin board interposer.

Figure 1:
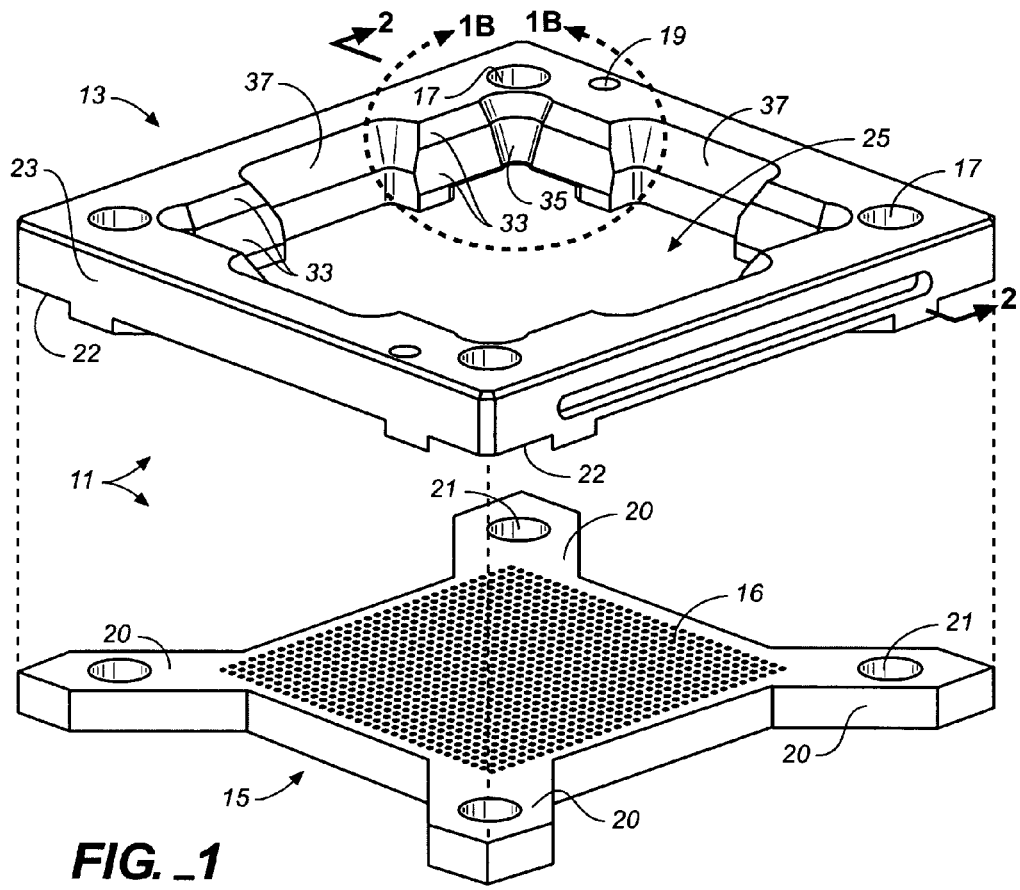
FIG. 1 is an exploded, top perspective view of a contactor nest in accordance with the invention, together with a pin board interposer to which the contactor nest is mounted.
Figure 1A:
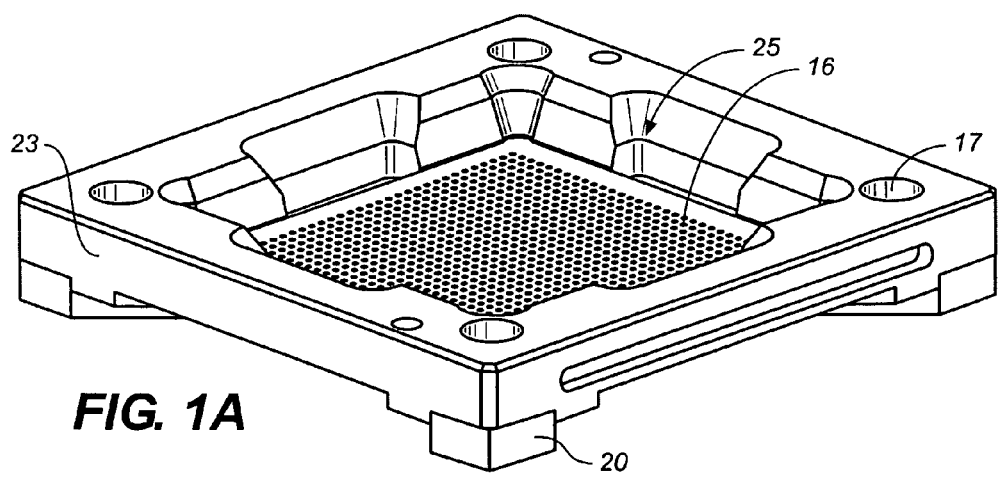
FIG. 1A is a top perspective view thereof, with the contactor nest mounted over the pin board interposer.
Figure 1B:
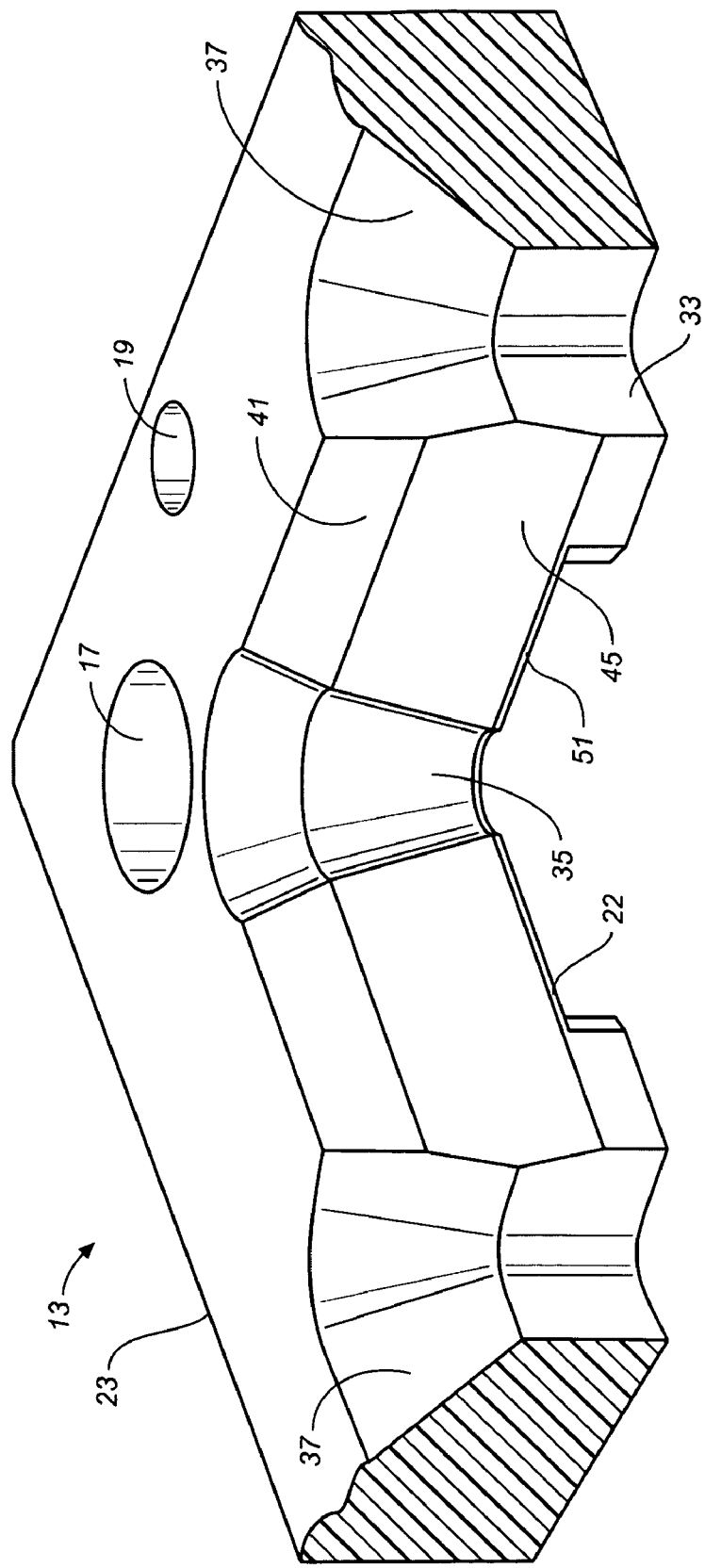
FIG. 1B is a fragmentary, top perspective view of one corner of the IC pocket of the contactor nest.
Figure 3A:
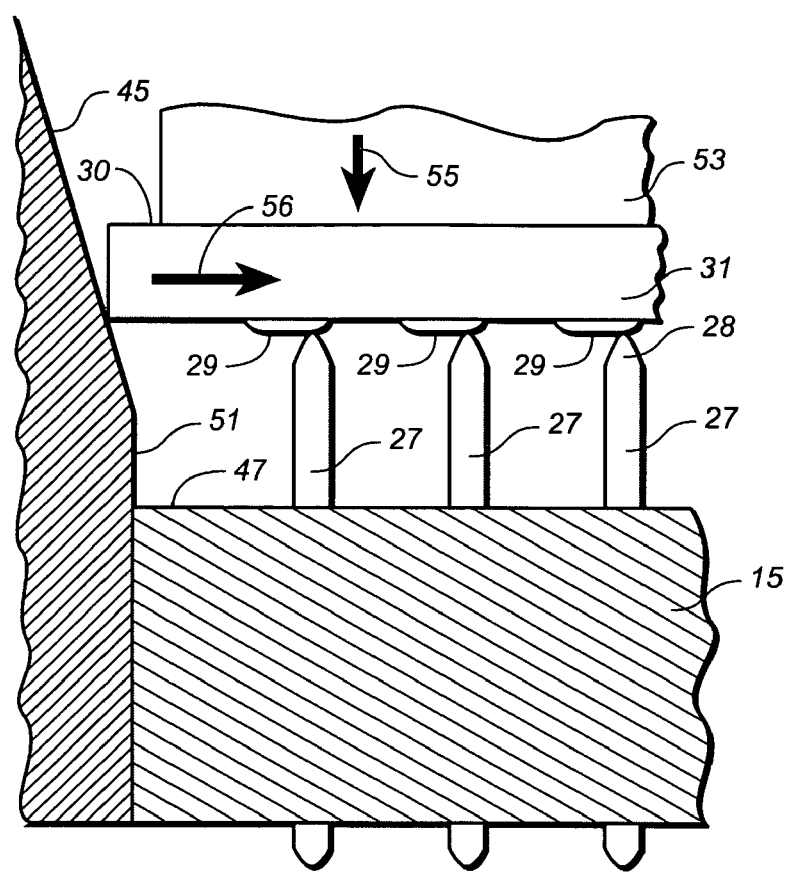

FIG. 3A is an enlarged, fragmentary, and cross-sectional view of the bottom of the IC pocket of the contactor nest, illustrating the centering action of the centering guide wall section of the IC pocket as an IC device approaches the spring pins of the pin board interposer, and further illustrating the scrubbing action of the spring pins across the pads of the IC device caused by this centering movement.

Figure 3B:
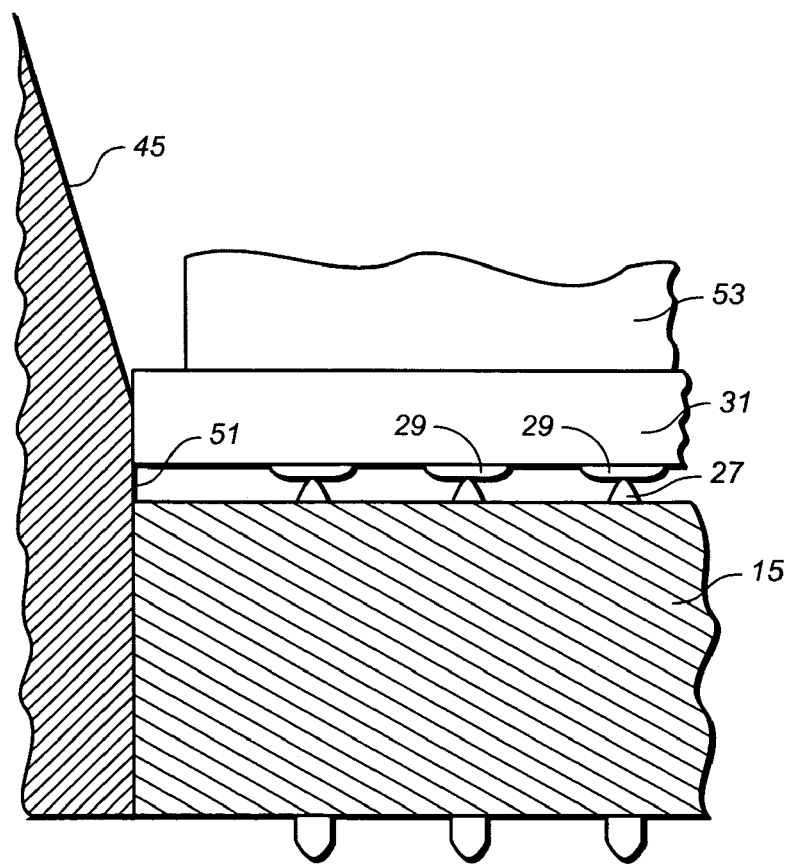

FIG. 3B is another enlarged, fragmentary, cross-sectional view of a bottom corner of the IC pocket of the contactor nest as shown in FIG. 3A, with the IC device fully centered and further depressed in the IC pocket.

DESCRIPTION OF THE ILLUSTRATED EMBODIMENT

Referring now to the drawings, a test contactor 11 is comprised of a contactor nest 13 and a pin board interposer 15, which together are mounted by a load board (not shown) by suitable fasteners (not shown) inserted through fastener openings 17 and 19 in the contactor nest and the fastener openings 21 in the interposer's corner arms 20, which fit into corner recesses 22 on the underside the perimeter frame 23 of the contactor nest. In addition to perimeter frame 23, the contactor nest has a central IC device pocket 25 sized to receive and capture an IC device having a given footprint. When the contactor nest and pin board interposer are mounted together on a load board, the contactor nest will function to guide the IC device onto the pin board interposer and align the IC device with the interposer pins as hereinafter described. IC devices will typically be inserted into and removed from the contactor nest by automated chip handling equipment which are well known in the art.

Also as well known in the art, the pin board interposer 15 will be provided with an array of conductive spring pins, such as spring pins 27 shown in FIGS. 2A and 2B, the positioning and spacing of which will match the I/O contact pads on the bottom of the IC device to be tested, such as the pads 29 of IC device 31 shown in FIGS. 2A, 2B, 3A, 3B. In the illustrated interposer 15, the spring pins 27 are held in a center interposer wall 16 of a suitable thickness that allows the plunger ends 26, 28 of the of spring pins 27 to extend beyond the opposed surfaces of the interposer wall. Generally, the pin board interposer and contactor nest will be designed for testing specific IC devices having known dimensions and pad densities.

When an IC device is inserted into the IC pocket 25, it is guided to a centered position in the contactor nest by the pocket's guide walls, generally denoted by the numeral 33. Corner cut-outs 35 and side wall cut-outs 37 are provided in the pocket side walls to minimize the surface area of the guide walls contacting the edges of the IC device package. In the illustrated embodiment, the guide walls are seen to be divided into three portions or sections. The first of these sections, which is at the top opening 39 of the IC pocket, is a relatively short, and relatively steeply angled lead-in section 41. Suitably, this section would have a lead-in angle in the neighborhood of 30 degrees in relation to the IC device insertion axis, which is represented by the insertion direction arrow 43 in FIG. 2A. Following this lead-in section, there is a more gradually inclined centering guide wall section 45 that extends down toward the bottom of the IC pocket, as defined by an IC device seating plane 47. The IC seating plane 47 is the plane at which the flat, top surface 49 of the pin board interposer 15 is located when the contactor nest is mounted onto the interposer. In order to achieve gradual centering of the IC chip as the chip approaches the IC seating plane 47, the angle of the centering section 45 of the pocket guide walls relative to the IC insertion axis 43 is relatively small as compared to the angle of the lead-in section 41. Suitably, this angle is between about 2 and 20 degrees, with a preferred range being between 5 and 15 degrees.

The centering section 45 of the guide walls tapers down to and terminates at a bottom perimeter portion which presents an opening that corresponds in size to the edge-to-edge dimensions of the IC device package 31 under test. In the illustrated embodiment, this bottom perimeter portion is in the form of a very short vertical straight wall section 51 that acts to capture the centered IC device when it is fully inserted into the bottom of the pocket 25 as hereinafter described. The length of this vertical straight wall section is suitably in the range of 0.50 mm or less, and preferably smaller than the thickness of the IC device to be tested. It is contemplated that there could be no bottom straight section of the guide walls, in which case the centering section 45 of the guide walls would taper all the way down to the IC device seating plane 47.

The centering action of the pocket guide walls of the contactor nest of the invention is best illustrated in the exploded views of FIGS. 3A and 3B. Once the IC device 31 under test is inserted into the top opening 39 of the IC pocket 25, a depressor member 53 of an automated chip testing machine will continue to press on the top 30 of IC chip 31, forcing the IC chip toward the bottom of the pocket and the pin board interposer 15. Because the IC device is never perfectly centered within the pocket, at least one the edge of the device will come in contact with the centering wall section of the pocket's guide walls. As represented by horizontal arrow 47 in FIG. 3A, these guide walls will force the IC device toward the center of the pocket, and continue to do so until the IC device reaches the guide wall's relatively short straight section 51 at the bottom of the pocket, where the IC device is perfectly centered. As seen in FIG. 3A, plunger ends 28 of spring pins 27 extend above this straight section. Consequently, as the guide walls of the centering section 43 continue to center the IC device prior to reaching straight section 51, the ends of spring pins will scrub across the I/O pads 29 of the IC device, thereby dislodging any foreign material that may be present on these pads. As the IC device bottoms out on the top of the interposer, the ends of the spring pins of the interposer will be centered over the IC device pads as illustrated in FIG. 3B. At this point, the pads will have been scrubbed by the horizontal centering action of the centering section of the guide walls for improved electrical contact. Due to the cleaning effect of this scrubbing action, spring pins having lower spring forces can be used in the interposers. Also, because the size of the pocket opening is larger than the dimensions of the IC device for nearly the entire travel distance of the IC device, the risk of the IC device jamming in the pocket as it is pushed into the pocket is substantially reduced.

While the improved contactor nest of the present invention has been described in considerable detail in the forgoing specification and claims, it shall be understood that embodiments of the invention other than illustrated and described herein that would be within the scope and spirit of the invention are possible. For example, it is contemplated that the pocket of the contactor nest could be provided without a lead-in that is steeply angled relative to the relatively long centering section of the guide walls. A lead-in section could have a guide wall angle close to the angle of the centering section, or there could be no lead-in section, in which case the centering section would extend to the top of perimeter frame 23. Also, it is possible that the centering guide wall section 45 could be comprised of guide walls of more than one angle within the preferred range of angles, or even a graduated angle. Still further, while the contactor nest and pin board interposer are illustrated as separate parts, it is possible for the interposer to be integrated into the contactor nest to provide a contactor of a unitary construction.

What we claim is:

1. An improved contactor nest for holding IC devices having contact pads against a pin board interposer having an array of conductive spring pins with protruding plunger ends, said contactor nest comprising:
    a perimeter frame having a top and a bottom, and
    an IC pocket in and accessible from the top of said frame for receiving a size-compatible IC device with a defined footprint, said pocket having a top opening which is oversized in relation to the footprint of the IC device, an IC insertion axis, an IC seating plane which is perpendicular to said IC insertion axis and which defines the bottom of said pocket, and a bottom perimeter portion at said IC seating plane which corresponds to the footprint of the IC device, the bottom of said IC pocket being adapted to receive the pin board interposer such that the protruding plunger ends of the spring pins of the pin board interposer extend upwardly into said IC pocket from said seating plane,
    said IC pocket further including guide walls for guiding an IC device into said IC pocket from the oversize top opening thereof to said IC seating plane, said guide walls including an IC device centering section having a gradual angle relative to said insertion axis, said centering section of the guide walls extending down to the bottom perimeter portion of said pocket at said seating plane for gradually centering the IC device in said pocket as the IC device approaches said IC seating plane, said IC device centering section having a depth that causes the contact pads of an IC device that advances through said centering section to contact the plunger ends of the spring pins of the pin board interposer before the IC device travels the full depth of said centering section.

2. The improved contactor nest of claim 1 wherein the IC device centering section has an angle of between about 2 degrees and 20 degrees in relation to the IC insertion axis.

3. The improved contactor nest of claim 1 wherein the IC device centering section has an angle of between about 5 degrees and 15 degrees in relation to the IC insertion axis.

4. The improved contactor nest of claim 1 wherein the bottom perimeter portion of said IC pocket is comprised of a relatively short bottom straight wall section, and wherein the bottom straight wall section of said IC pocket is shorter than the length of the protruding plunger ends of the spring pins of the pin board interposer that extend into said IC pocket.

5. The improved contactor nest of claim 4 wherein the bottom straight wall section of said IC pocket has a length no greater than about 0.50 mm.

6. The improved contactor nest of claim 1 wherein the guide walls of said IC pocket further include a top lead-in wall section having an angle relative to the insertion axis of said IC pocket that is greater than the gradual angle of the centering section of said guide walls.

7. The improved contactor nest of claim 6 wherein the angle of the guide walls at said top lead-in section is approximately 30 degrees.

8. The improved contactor nest of claim 6 wherein the length of the top lead-in section of said pocket guide walls is shorter than the length of said centering section.

9. The improved contactor nest of claim 1 wherein said guide walls have cut-outs to minimize the surface area of the guide walls contacting the IC device as the IC device advances into said IC pocket.

10. The improved contactor nest of claim 9 wherein said IC pocket includes corners, and wherein said cut-outs include corner cut-outs.

11. An improved contactor nest for holding IC devices having contact pads against a pin board interposer having an array of conductive spring pins with protruding plunger ends, said contactor nest comprising:
    a perimeter frame, and
    an IC pocket in and accessible from the top of said frame for receiving a size-compatible IC device with a defined footprint, said pocket having a top opening which is oversized in relation to the footprint of the IC device, an IC insertion axis, an IC seating plane which is perpendicular to said IC insertion axis and which defines the bottom of said pocket,
    said IC pocket including
        a lead-in guide wall section at the top opening of the IC pocket, said lead-in guide wall section having a guide wall angle that is a relatively steep angle in relation to said insertion axis,
        an IC device centering guide wall section having a guide wall angle that is in a range of between 2 and 20 degrees relative to said insertion axis, and
        a relatively short bottom straight guide wall section at said seating plane which is sized to correspond to the footprint of the IC device and at which the IC device will be centered in relation to the insertion axis, said centering guide wall section extending from the lead-in guide wall section to the bottom straight guide wall section of said IC pocket.

12. The improved contactor nest of claim 11 wherein the bottom straight wall section of said pocket has a length of between about 0.50 mm.

13. The improved contactor nest of claim 12 wherein the IC device centering guide wall section has an angle of between about 5 degrees and 15 degrees in relation to the IC insertion axis.

14. The improved contactor nest of claim 13 wherein the angle of the lead-in guide wall section of said IC pocket is approximately 30 degrees.

15. A method of bringing contact pads of an IC device under test into electrical contact with spring pins of a pin board interposer situated at an IC device seating plane, comprising:
   gradually centering the contact pads of the IC device in relation to the spring pins of the pin board interposer as the IC device is advanced toward the IC device seating plane, and
   continuing to gradually center contact pads of the IC device in relation to the spring pins of the pin board interposer after the IC device contact pads begin depressing the spring pins of the pin board interposer, such that the centering movement of the IC device causes the spring pins of the pin board interposer to scrub across the contact pads of the IC device.

16. The method of claim 15 wherein the IC device is brought into final centered relation with the spring pins of the pin board interposer before the IC device reaches the IC device seating plane.

17. The method of claim 15 wherein the IC device is gradually centered in relation to the spring pins of the pin board interposer at an angle of between 2 and 20 degrees.

18. The method of claim 15 wherein the IC device is gradually centered in relation to the spring pins of the pin board interposer at an angle of between 5 and 15 degrees.

19. A method of bringing contact pads of an IC device under test into electrical contact with the spring pins of a pin board interposer situated at an IC device seating plane, comprising:
   approximately centering the IC device so that the contact pads of the IC device approximately align with the spring pins of the pin board interposer, and
   advancing the IC device toward the spring pin interposer at an angle of between about 2 and 20 degrees from a perpendicular attack angle until the spring pins of the pin board interposer contact the contact pads of the IC device, and
   thereafter continuing to gradually center the contact pads of the IC device in relation to the spring pins of the pin board interposer so that said spring pins scrub the contact pads of the IC device.

20. The method of claim 19 wherein the IC device is gradually centered in relation to the spring pins of the pin board interposer at an angle of between 5 and 15 degrees from a perpendicular attack angle.

21. The method of claim 19 wherein the IC device is brought into its final centered relation with the spring pins of the pin board interposer before the IC device reaches the IC device seating plane.

* * * * *